United States Patent [19]

Buhl et al.

[11] 4,448,802
[45] May 15, 1984

[54] METHOD AND APPARATUS FOR EVAPORATING MATERIAL UNDER VACUUM USING BOTH AN ARC DISCHARGE AND ELECTRON BEAM

[75] Inventors: Rainer Buhl, Sargans, Switzerland; Eberhard Moll, Triesen, Liechtenstein; Helmut Daxinger, Wangs, Switzerland

[73] Assignee: Balzers Aktiengesellschaft, Liechtenstein

[21] Appl. No.: 357,719

[22] Filed: Mar. 12, 1982

[30] Foreign Application Priority Data

Mar. 13, 1981 [CH] Switzerland ............... 1719/81

[51] Int. Cl.³ ............... C23C 13/00; C23C 13/12
[52] U.S. Cl. ............... 427/42; 427/248.1; 427/38; 118/726; 118/723; 118/50.1; 373/1; 373/10; 219/121 EF; 219/121 EG; 219/121 ES; 219/121 EM; 219/121 PA; 219/121 PB; 219/121 PY
[58] Field of Search ............... 427/42, 38, 248.1, 250; 118/723, 726, 727, 719; 219/121 EB, 121 EM, 121 EF, 121 EG, 121 EE, 121 PA, 121 PB, 121 PX, 121 ER, 121 ES, 121 PY; 204/192 R, 192 N, 298; 373/10, 13, 1

[56] References Cited

U.S. PATENT DOCUMENTS 4,061,871 12/1977 Sommerkamp et al. ...... 219/121 EF
4,197,175 4/1980 Moll et al.

FOREIGN PATENT DOCUMENTS 2624005 12/1977 Fed. Rep. of Germany ... 204/192 N

OTHER PUBLICATIONS

Korobov et al. "An Electron Beam Evaporator Fitted to A UVM-2ME Equipment" *Instruments and Experimental Techniques*, vol. 17, No. 6, pt. 2, p. 1794, NY, May 1975.

Primary Examiner—John D. Smith
Assistant Examiner—Bernard F. Plantz
Attorney, Agent, or Firm—McGlew and Tuttle

[57] ABSTRACT

A method of evaporating an evaporative substance under vacuum comprises bombarding the evaporative substance with electrons from a low voltage arc discharge established between a cathode and an anode which is located in an evaporation chamber and simultaneously supplying additional power for evaporation to the evaporative substance by means of an electron gun which produces an electron energy in excess of one keV. A device for carrying out the invention comprises an evacuable bowl, an evaporation chamber with a receptacle therein for a substance to be evaporated and means for establishing a low voltage arc discharge between a cathode and an anode located in the evaporation chamber, a further provision of an electron gun for bombarding the substance with electrons which has an electron energy more than one kilovolt.

5 Claims, 5 Drawing Figures

METHOD AND APPARATUS FOR EVAPORATING MATERIAL UNDER VACUUM USING BOTH AN ARC DISCHARGE AND ELECTRON BEAM

FIELD AND BACKGROUND OF THE INVENTION

The present invention relates in general to vapor coating and in particular to a new and useful method and apparatus of evaporating and evaporative substance under vacuum.

Known are electron beam evaporators operated with a high electron current (for example 100A) and a relatively low acceleration voltage (for example 100 V). Either hollow cathodes heating up through ion bombardment, or heated hot cathodes are employed for this purpose. Discharges based on electron sources of this kind will be termed low voltage arcs in the following. In this connection, a continuous supply of inert gas (such as argon) to the cathode is advantageous and makes it possible to produce well focused beams of high intensity with a low acceleration voltage. The gas serves the purpose of compensating for the space charge, so that a plasma is produced. Low voltage arcs can be concentrated and directed to the evaporative substance through magnetic fields, and have the great advantage of strongly activating the gas or residual vapor in the evaporation chamber. Prior art arrangements for evaporation by means of a low voltage arc have the disadvantage, however, that they can use only evaporative materials which are electrically conducting or become electrically conducting at the evaporation temperature. But they are frequently difficult to use even for refractory metals, since the achievable power density is not satisfactory. In addition, with an increasing evaporation rate, the vapor density above the evaporative substance continues to rise, so that the low energy electron beam of the low voltage arc loses the greatest part of its energy already in the vapor, and the energy transferred to the evaporative substance is insufficient. This leads to a critical limitation of the evaporation rate obtainable in practice.

SUMMARY OF THE INVENTION

The invention is directed to a method in which no limits are set to the substance to be evaporated or to the activation of the vapor or residual gas in the evaporation chamber.

In accordance with the method of the invention for evaporating an evaporative substance under vacuum, the evaporative substance is bombarded with electrons from a low voltage arc discharge which is established between a cathode and an anode located in the evaporation chamber. In addition, in accordance with the method, additional power for evaporation is supplied to the evaporated substance by means of an electron gun which produces electron energies in excess of 1 keV.

Due to this provision, surprisingly, not only practically any substance, which means also metals resistant to extremely high temperatures and dielectric materials, can be evaporated at a high rate, but also the vapor and the gases which might still be present in the evaporation chamber or supplied thereto, for example for carrying out a reactive evaporation, can be activated to a high degree. It is the electron beam carrying electrons with a kinetic energy of more than one keV which causes the high evaporation rate, even if substances are evaporated which are poor conductors of electricity. At the same time, the current of low energy electrons is much more intense and since it produces a stronger activating and ionizing effect, activates the vapor or the reaction gas to the desired degree.

The inventive method has the further advantage that a coupling of operating parameters, such as evaporation rate, residual gas pressure, residual gas composition, ionization density, etc., which is inevitable in prior art methods of evaporation with a low voltage arc, can be avoided, and best conditions can be insured for a specific process.

Another objective of the invention is to provide a device which is particularly suitable for carrying out the inventive method. Such a device comprises an evaporation chamber, a receptacle for an evaporative substance, and a source of electrons for bombarding the substance with electrons from a low voltage arc discharge. The characterizing feature is that an electron gun for bombarding the substance with electrons having an energy of more than 1 keV is provided in the evaporation chamber in addition. It is advisable to guide and focus the beam of high energy electrons by means of a magnetic field. The magnets serving this purpose may be employed at the same time for guiding and focusing the beam of electrons from the low voltage arc discharge. Because of the different energy contents of the two beams, only special forms of magnetic fields and electron beam paths are suitable.

Accordingly, it is an object of the invention to provide an improved method of evaporating an evaporative substance under vacuum wherein in addition to establishing a low voltage discharge in an evaporation chamber an additional power for evaporation is supplied to the chamber and to evaporative substance therein by an electron gun producing electron energy in excess of 1 keV.

A further object of the invention is to provide a device for evaporating an evaporative substance under vacuum which includes an evacuable evaporation chamber with a receptacle therein for a substance to be evaporated and means for establishing a low volt discharge between a cathode and an anode located in the chamber further including an electron gun for bombarding the substance with electrons having an electron energy of more than 1 keV.

A further object of the invention is to provide a device for evaporating a substance which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
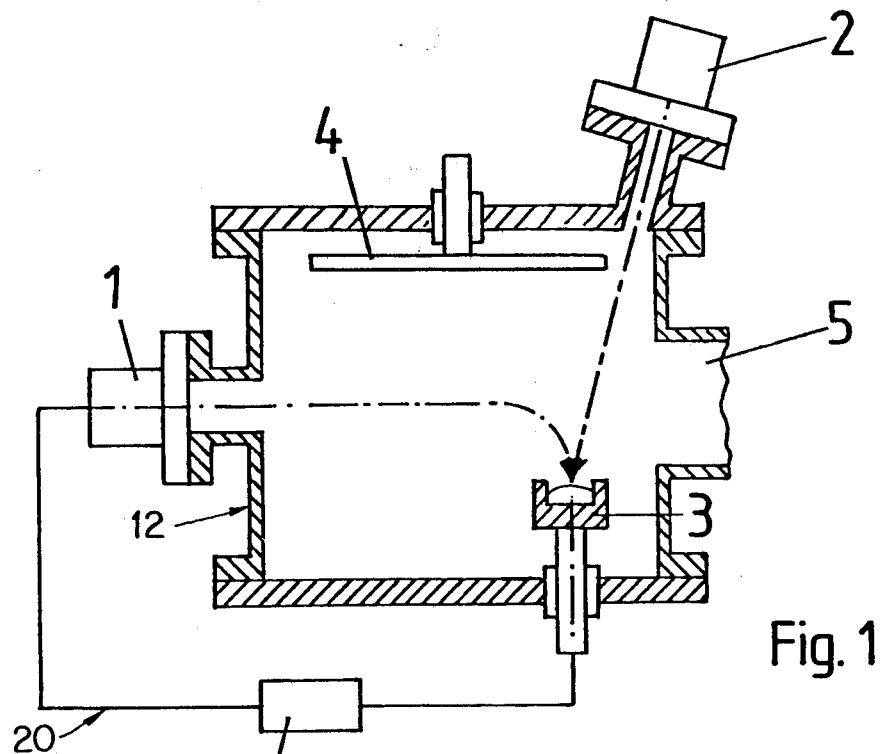
FIG. 1 is a diagrammatic sectional view of an evaporating chamber which includes a low voltage discharge apparatus for evaporating a substance to be coated to a substrate on a support structure and including an elctron gun producing additional power in accordance with the invention.

Referring to the drawings in particular the invention embodied therein comprises a method and apparatus for evaporating an evaporative substance, which for example, is placed in a crucible 3 disposed in an evaporation chamber generally designated 12 which is connected to a pump connection 5 for maintaining a vacuum in the chamber. The evaporative substance in the crucible 3 is bombarded with electrons from a low voltage arc discharge which is established between a cathode in a cathode chamber 1 and an anode, for example which is formed by the crucible 3, and which are located in the evaporation chamber 12. In accordance with the invention, additional power for evaporation is simultaneously supplied to the evaporative substance by means of an electron gun 2 which produces electron energies in excess of 1 keV. The apparatus as shown in FIG. 1 also includes a support 4 for supporting and carrying a substrate to be coated.

Figure 2:
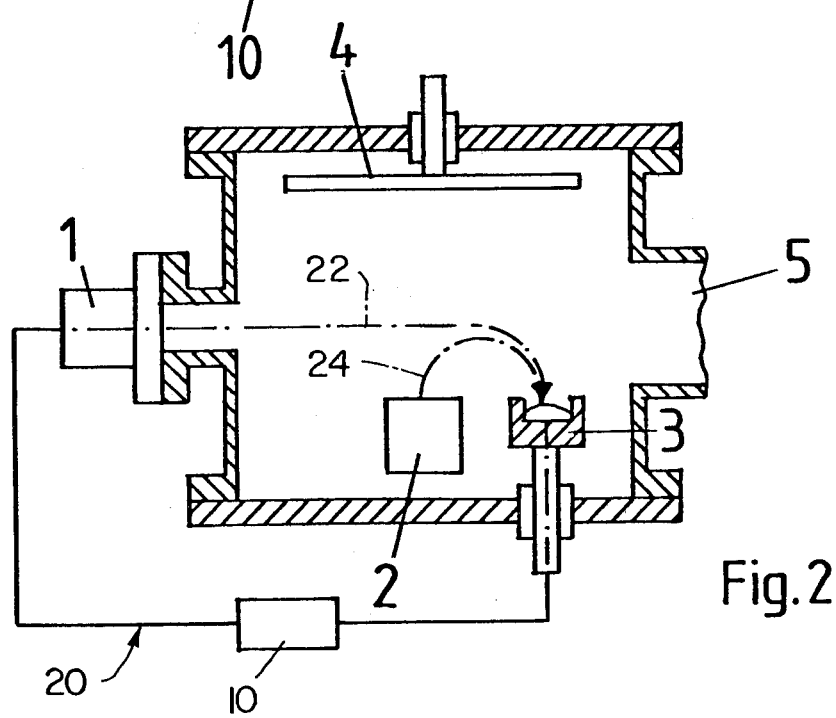
FIGS. 2,3,4 and 5 are views similar to FIG. 1 of different embodiments of the invention.
Figure 3:
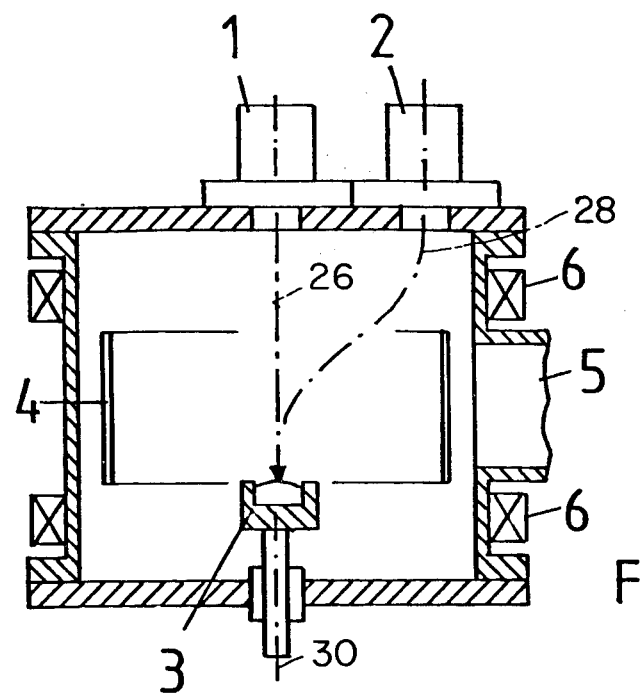

FIGS. 1, 2 and 3 are diagrammatic views of embodiments in which electron sources, known per se, for a low voltage arc discharge and for an electron beam with electrons having an energy of some keV are mounted in an evaporation chamber. FIGS. 1 to 3 show three different possibilities of arranging such sources.

Figure 4:
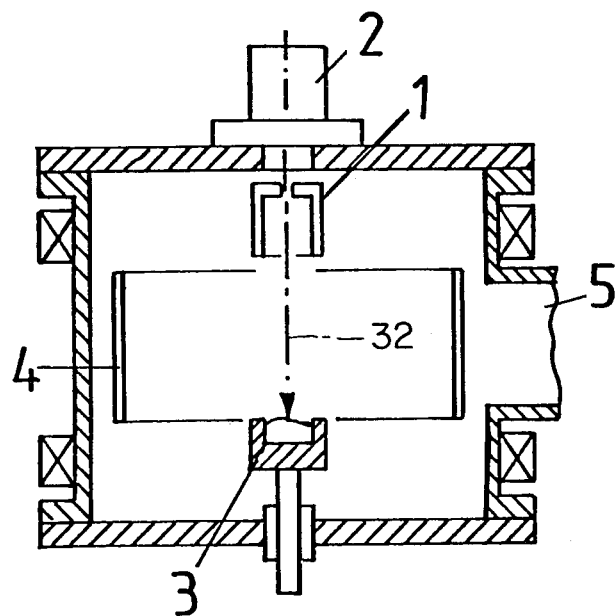
Figure 5:
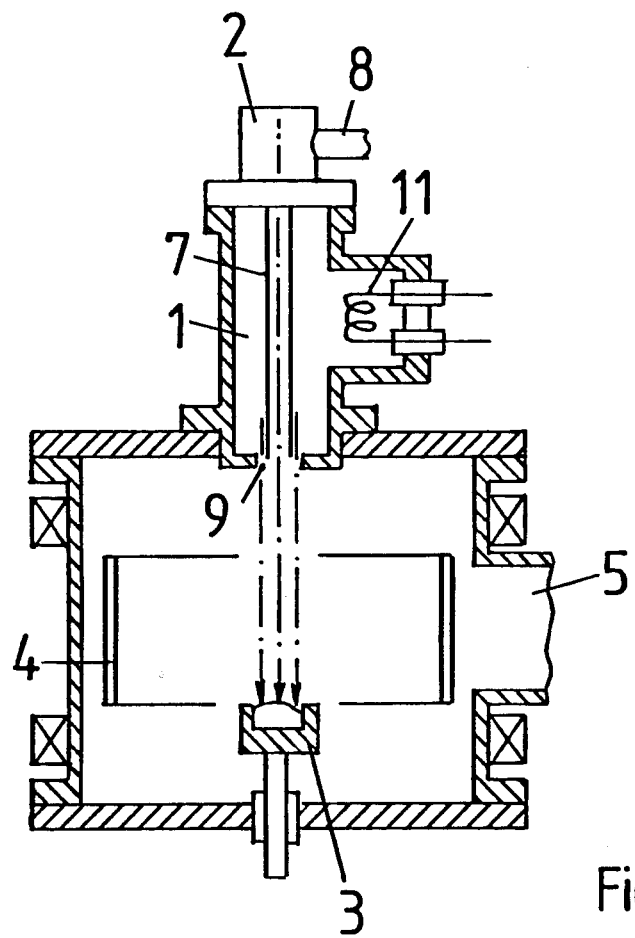

FIG. 4, on the contrary, shows a special arrangement in which the two electron beams are coaxial with each other and the high energy electron beam passes through the cathode chamber of the low voltage arc discharge. FIG. 5 shows a similar arrangement in which the two electron beams are again coaxial but spatially separated from each other, with the electron source of the low voltage arc discharge comprising an electron gun for higher energy electrons.

In all of the figures, the cathode chamber of the low voltage arc discharge is designated 1 and the electron gun furnishes the high energy electrons is designated 2. Further, all the figures show a crucible 3 in which the substance to be evaporated is received, and a collector 4 where the produced vapor can condensate. The collector, for example, may be identical with the substrates which are held in place by a support and on which thin layers of the evaporated substance are to be deposited. Also, in all of the figures, a pump connection 5 is shown through which the evaporation chamber is evacuated to a suitable vacuum, for example, to a pressure of $10^{-4}$ millibar, for depositing thin layers. In the last mentioned case of application, frequently the substrate support is secured in an insulating manner, and a negative potential is applied thereto during the condensation of the vapor, to accelerate the motion of the ions from the activated vapor and residual gas (plasma) to the substrates; this is termed "ion plating".

An electrical circuit 20 of the voltage arc including current source 10 is indicated in FIGS. 1 and 2 only. The low voltage arc may be held at a floating potential, i.e., remain without connection to the housing of the evaporation chamber, or it may be operated with a connection of the negative pole of source 10 to the housing. The positive pole of current source 10 may be connected to a separate anode introduced through the chamber wall in an insulating manner, or to the receptacle of the evaporative substance, thus the crucible. Since in the last mentioned instance, the crucible is also the target for the high energy electron beam from the electron gun 2, it may be necessary to provide a safety in the form of current paths preventing too high voltages during a possible failure of the low voltage arc. A satisfactory measure, for example, would be a 22 ohm discharge resistor between the crucible and the housing, representing practically no load for the operation of the low voltage arc.

For clarity, no further details are shown which otherwise are useful for operating an evaporator as described, such as a cooling water circuit, valves for supplying gas into the cathode chamber of the low voltage arc dishcarge, or into the evaporation chamber (for example, to effect a reactive evaporation). Further, various auxiliary coils for producing magnetic fields might be provided, for example, on the cathode chamber of the low voltage arc ( as disclosed in German OS No. 28 23 876), auxiliary vacuum pumps for operating the source of high energy electrons, and various other devices known in the art.

To carry out the inventive method, the substrates to be coated are secured to a supporting structure 4 on the side facing the evaporative source, the substance to be evaporated is placed in crucible 3, and the evaporation chamber is closed and evacuated. Upon reaching a pressure of about $10^{-4}$ millibar, argon is supplied into the cathode chamber of the low voltage arc discharge through a valve (not shown) and in an amount such that the pressure in the container rises to about $10^{-3}$ millibar. The low voltage arc may then be drawn and, for example, 35 amperes flow between the anode and cathode under a voltage of 60 volts. As mentioned above, for example, a potential negative relative to the arc plasma may be applied to the substrate support, to accelerate the positive ions from the plasma toward the substrates. The ion current through the substrate support satisfies the conditions of a Langmuir probe and amounts in the considered example to 2 amperes. Therefore, if a potential of −500 volts is applied to the substrate, the substrates will be exposed to an argon ion bombardment having a power of 1 kw.

A considerable evaporation rate may be obtained with the described arrangement already by guiding the low voltage arc through a suitable magnetic field; however, the coils needed therefor are not provided in the embodiment, since a much stronger increase in the evaporation rate is obtained with the inventive use of an electron beam carrying higher energy electrons. The electron beam is produced, for example, by a so-called tele-focus electron source and directed at the evaporative material in the crucible. Under an acceleration voltage fo 20 kv, for example, the beam yields a current of 0.3A. The power density obtainable with a focused electron beam as the electron strike the evaporative substance in the crucible, results in an intense local heating and, consequently, in a high evaporation rate. If a reactive gas is supplied into the container as from the start of the evaporation, the molecules of both this gas and the vaporized substance are activated and partly ionized by the electrons of the low voltage arc and by the argon ions. For example, with $N_2$ employed as the reactive gas and Ti as the evaporative material, a titanium nitride layer can be deposited on the substrates. This layer forms under the constant impingement of titanium, nitrogen, and argon ions and has therefore the desired adhesive strength and density ("reactive ion-plating").

In another embodiment shown in FIG. 2, the electron beam carrying high energy electrons is directed, by means of a magnetic field whose lines of flux extend substantially perpendicularly to the drawing plane, at the substance to be evaporated. On their way from the cathode to the crucible, the electrons are deviated through 180° and focused at the same time. The electrons from source 1 of the low voltage arc are also deviated by this magnetic field, however, since these electrons have a smaller kinetic energy, the radii of curvature of their paths in the magnetic field are substantially smaller. The electrons of the low voltage arc therefore move along cycloidal paths. The paths indicated at 22 and 24 in FIG. 2 does not belong to a single electron but is the mean path of the low voltage electron beam. The extension of the effective paths of the electrons due to the cycloidal motion and the higher ionization of the gas or vapor resulting therefrom in the evaporation chamber increase the current flowing to the substrate support by 20 to 40% as compared to the current of the low voltage arc. Since the magnetic field deviating the electrons from source 2 into the crucible also extends in the close vicinity of the crucible, this additional ionization includes the vapor above the crucible, and just this particularly high activation of the vapor makes it possible to fully utilize the high evaporation rate of the evaporative source with fast electrons and produce layers in accordance with the so-called ion plating method.

The evaporator 2 shown in FIG. 2 may be a device of the type with a 270° deviation of the electron beam. In this device, the electrons are accelerated with 6 to 10 kv, and the maximum power is 14 kw. Such evaporators are frequently employed also for producing layers by vapor deposition in high vacuum. With the described arrangement, firmly adhering metal layers can be produced on metallic substrates, for example. The same advantageous structure with a high packing density of the molecules is obtained as known per se in coatings produced by evaporation in a low voltage arc, however, in this case, the evaporation rate is multiplied.

Another embodiment is shown in FIG. 3: The two electron beams 26 and 28 are directed from their sources to the crucible through a homogeneous magnetic field which is parallel to the chamber axis 30 and is produced by the two coils 6. The low energy electrons of the low voltage arc migrate substantially along the lines of flux to the crucible, with the electrons deviating from this direction being forced to follow narrow helical paths. In this way, the low voltage arc is concentrated and strikes the evaporative substance with a higher power density than in the example of FIGS. 1 and 2. The beam of fast electrons, on the contrary, arrives obliquely to the direction of the magnetic field (out of the drawing plane) and reaches crucible 3 after half a helical turn. The focusing properties of a homogeneous field at a 180° deflection can thus be utilized.

As mentioned, the arrangement described in the foregoing has the advantage that both the electron beams from the cathode 1 and gear 2 are focused by the same magnetic field. Of course, the intensity of this field must be brought into relation with the acceleration voltage of the high energy electron beam and with the angle of incidence thereof and the location of the two electron sources. For example, with a distance of 10 cm between electron gun 2 and cathode chamber 1 of the low voltage arc, and a vertical distance of 40 cm of the electron gun above the crucible at an electron energy of 10 keV, a magnetic field of $2.10^{-3}$ tesla (Ebm$^{-2}$) is needed.

In an arrangement according to FIG. 4, the two electron beams have a common axis 32 while also following the lines of flux of the same magnetic field which again, in the simplest design, may be homogeneous and parallel to the axis of the container. The high energy electron beam is directed through cathode chamber 1, which is open to the evaporation space and represents the electron source for the low voltage arc. As in the previous example, this may be a hollow cathode or a thermionic cathode. With an interposed magnetic field, the low voltage arc always uses the cathode chamber opening facing the evaporation chamber, while the gas such as argon, introduced to the cathode chamber, also escapes through the upper opening in the direction of source 2 of high energy electrons. This is disturbing and can be reduced only by increasing the resistance to the gas flow to a reasonable degree, for example by inserting screens.

As compared to the embodiment of FIG. 3, a stronger magnetic field best suited for a low voltage arc discharge can independently be produced in the embodiment of FIG. 4. This stronger magnetic field is advantageous also for the passage of the beam of fast electrons through cathode chamber 1. That is, a gas pressure between $10^{-1}$ and $10^{-2}$ millibar is to establish in the cathode chamber of the low voltage arc discharge. This required small apertures. On the other hand, the passage of the beam of fast electrons to this chamber must not be limited by too small apertures. The invention makes it possible to meet these requirements. The loss still remains measurable if the cross section of the beam of fast electrons departs from an ideal circle, however, the maximum power density on the substance to be evaporated can thereby be affected. It is true that a directional dispersion also occurs at the passage through cathode chamber 1 which is filled mostly with inert gas, however, this effect on the evaporation rate may almost completely be eliminated by the magnet.

Still another embodiment is shown in FIG. 5. This is a particularly preferred arrangement with two coaxial electron beams passing through a magnetic field. The low voltage arc is directed from hot cathode 11 in cathode chamber 1 through an annular gap 9 into the container. The further path of the arc to the crucible is determined by the magnetic field. The tubular shape of the arc imposed by annular gap 9 is maintained up to the crucible.

The beam of high energy electrons initially passes through a cooled or high temperature resistant tube 7 extending through cathode 1. At the same time, the source and the acceleration path of the high electron beam is screened against the increased gas pressure in the cathode chamber of the low voltage arc discharge. Therefore, a high vacuum pump having a suction capacity of 100 liters per second and connected at 8, is sufficient for obtaining a satisfactory pressure ratio between the two electron beam sources. The beam of high energy electrons entering the container is guided by the magnetic field and reaches the evaporative substance in the crucible along an almost straight path. This path extends within the surrounding tube formed by the low voltage arc. The magnetic field focuses and guides the beam of high energy electrons and also concentrates the electrons of the low voltage arc discharge. Since the space charge in the evaporation chamber is compensated for by ions which have been produced from gas molecules originating in the evaporative substance, the energy density obtainable on the substance is very high. With the evaporation of titanium for example, and as compared to a rate obtainable with a pure low voltage arc evaporation, the evaporation rate is thereby increased by the factor 25.

While specific embodiments of the invention have been shown and described in detail to illustrate the application of the principles of the invention, it will be understood that the invention may be embodied otherwise without departing from such principles.

What is claimed is:

1. A method of evaporating an evaporative substance under vacuum comprising: generating a low voltage arc in a cathode chamber for receiving an ionizable gas and containing a heatable cathode, the chamber having a small opening communicating with an evacuable evaporation chamber, the low voltage arc being generated along an axis passing through the small opening; generating a high voltage electron beam, by means of an electron gun producing electron energy in excess of 1 keV, which is directed along the axis through the small opening; the low voltage arc and the high voltage electron beam passing coaxially through the small opening into the evaporation chamber in a manner such that a low voltage arc is established in a path surrounding the high voltage electron beam; positioning a crucible forming an anode for the low voltage arc in the evaporation chamber and on the axis for receiving the low voltage arc and the high voltage electron beam to evaporate a substance in the crucible; and placing a substrate in the evaporation chamber for receiving the evaporated substance from the crucible.

2. A device for evaporating an evaporative substance under vacuum, comprising: an evacuable evaporation chamber; a receptacle provided in said evaporation chamber for a substance to be evaporated; low voltage arc means for establishing a low voltage arc between a cathode and an anode located in said evaporation chamber; and an electron gun for bombarding the substance with a high voltage electron beam having an electroenergy more than 1 KeV; said low voltage arc means comprising an anode, a hot cathode and a cathode chamber surrounding said hot cathode for containing an ionizable gas separately of said evaporation chamber and communicating with said evacuation chamber through a small opening; said anode and cathode and said electron gun being arranged to discharge along a common axis with said high voltage electron beam passing coaxially through said small opening to said cathode chamber; said low voltage arc being established in a path surrounding said high voltage electron beam of said electron gun.

3. A device for evaporating an evaporative substance according to claim 2, including means for producing a magnetic field for guiding and focusing said low voltage arc discharge and the beam from said electron gun.

4. A device for evaporating an evaporative substance according to claim 2, including an extension of said evaporation chamber forming said cathode chamber, said small opening being in alignment with the substance to be evaporated, a support structure for a substrate to be coated disposed around the path from said small opening of said cathode chamber to the substance to be evaporated, and coil means establishing a magnetic field between said cathode and substrate to be evaporated.

5. A device for evaporating an evaporative substance according to claim 2, including a crucible forming said anode and said receptacle for the substance to be evaporated, said small opening aligned with said crucible, and a guide tube in said cathode chamber coaxial with said axis and extending through said cathode chamber for surrounding said high voltage electron beam of said electron gun, said guide tube terminating at said small opening.

* * * * *